United States Patent
Hernandez et al.

(10) Patent No.: US 6,399,502 B1
(45) Date of Patent: Jun. 4, 2002

(54) PROCESS FOR FABRICATING A PLANAR HETEROSTRUCTURE

(75) Inventors: Caroline Hernandez; Yves Campidelli, both of Grenoble; Maurice Rivoire, Meylan; Daniel Bensahel, Grenoble, all of (FR)

(73) Assignee: France Télécom, Paris (FR)

( * ) Notice: Subject to any disclaimer, the term of this patent is extended or adjusted under 35 U.S.C. 154(b) by 0 days.

(21) Appl. No.: 09/540,188

(22) Filed: Mar. 31, 2000

(30) Foreign Application Priority Data

Mar. 31, 1999 (FR) .............................. 99 04052

(51) Int. Cl.[7] .............................................. H01L 21/00
(52) U.S. Cl. ......................... 438/692; 216/38; 216/88; 438/745; 438/752; 438/753
(58) Field of Search .................. 438/429, 691, 438/692, 693, 718, 745, 752, 753; 216/38, 88–89, 91

(56) References Cited

U.S. PATENT DOCUMENTS 5,362,669 A * 11/1994 Boyd et al. .............. 438/692 X
5,906,951 A * 5/1999 Chu et al. ............... 438/753 X

* cited by examiner

Primary Examiner—William A. Powell
(74) Attorney, Agent, or Firm—Eric B. Meyertons; Conley, Rose & Tayon, P.C.

(57) ABSTRACT

The process comprises:

etching, in a semiconductor substrate (2), at least one trench (3) with predetermined width and depth; depositing, on the substrate and in the trench, a stack of successive and alternate layers of $Si_{1-x}Ge_x$ ($0<x\leq1$) and Si (5–8), the number and the thickness of which depend on the final use intended for the heterostructure; and chemical-mechanical polishing in order to obtain a final heterostructure having a plane upper main surface, level with which the stack layers deposited in the trench are flush.

8 Claims, 4 Drawing Sheets

PROCESS FOR FABRICATING A PLANAR HETEROSTRUCTURE

The present invention relates in general to a process for producing a planar heterostructure for the fabrication of electronic and/or optoelectronic devices, in particular in the microelectronics industry.

One of the crucial and often limiting steps of processes for fabricating integrated circuits is the step of etching by photolithography. In order to produce very thin patterns, typically with a width of less than 100 nm, photolithographic techniques require equipment which is both very expensive and time-consuming, such as optical exposure using x-rays or direct writing with an electron beam.

It would therefore be desirable, as far as possible, to do without the photolithography step for the fabrication of such microelectronic devices, and in particular for optoelectronic devices.

It has now been found that it is possible to do without or circumvent the photolithographic step for producing patterns in active material (CMOS gate or multiple quantum well layer, for example) with a very thin predetermined width by using the very good control which there is over the thickness of the deposits. Such an approach makes it possible to produce (principally optoelectronic) devices which are planar, that is to say at the surface of the specimen rather than in its bulk.

According to the invention, the process for fabricating a planar heterostructure comprises:

a) etching, in a semiconductor substrate and starting from an upper main surface of the substrate, at least one trench with predetermined width and depth having a bottom wall and vertical side walls;

b) depositing, on the upper main surface of the substrate and the bottom and side walls of the trench, a stack of successive and alternate layers of $Si_{1-x}Ge_x$ ($0 < x \leq 1$) and Si, the number and the thickness of which depend on the final use intended for the heterostructure; and c) chemical-mechanical polishing in order to obtain a final heterostructure having a plane upper main surface, level with which the stack layers deposited in the trench are flush.

In a first embodiment of the process of the invention, the stack of successive alternate layers does not fill the trench completely, and before the chemical-mechanical polishing step, a layer of a dielectric material is deposited in order to complete the filling of the trench.

In a second embodiment of the process of the invention, the stack of successive alternate layers in the trench is produced so as to leave a, for example central, recess in the trench, and before the chemical-mechanical polishing, the stack is etched so as to extend the recess down into the material of the substrate. A dielectric material is then deposited in order to fill the extended recess, and the chemical-mechanical polishing is carried out in order to obtain the final planar heterostructure.

In a third embodiment of the process of the invention, prior to the deposition of the stack, a layer of dielectric material filling the trench is deposited in the latter, and the dielectric material is etched so as to form, in the trench, a, for example central, partition dividing the trench into two half-trenches, and the two half-trenches are filled by depositing a stack of successive alternate layers.

The substrates suitable for the present invention are substrates made of bulk or thin-film silicon, for example silicon-on-insulator (SOI), or of bulk or thin-film germanium.

Clearly, the process of the invention may involve the production of a plurality of trenches in the substrate, according to the application intended for the device. The trenches may have identical or different widths depending on the a application. The depth of the trenches will also vary according to the application.

The side walls (flanks) of the trenches are preferably vertical, that is to say as close as possible to the <100> crystallographic direction and generally at an angle of from 70° to 80° with respect to the plane of the upper main surface of the substrate. If the flanks of the trenches are not vertical, then layers with uniform thickness will not be obtained on the flanks, tops and bottoms of the trenches during the subsequent deposition of the stack. Furthermore, the corner regions at the bottom or at the top of the trenches are sensitive regions in so far as the growth of the layers of the stack in these regions, although conformal, is perturbed. It is therefore preferable to distance these regions from the future active regions, for example by producing deeper trenches, that is to say having a high aspect ratio d/w (d=depth and w=width). The flanks of the trenches will also preferably have monocrystalline quality, that is to say that, after the etching, the surfaces of the trench will be oxidized then the oxide layer will be removed, for example by dissolving, in order to obtain surfaces without defects.

The trenches may be produced by any conventional process such as photolitho-etching using a mask.

The deposition of the alternate thin layers of $Si_{1-x}Ge_x$ and Si is in general heteroepitaxial or epitaxial deposition involving chemical vapour deposition (CVD). If the starting substrate is silicon or silicon-on-insulator, the Ge concentration in the $Si_{1-x}Ge_x$ alloy immediately deposited on the substrate may vary from a few per cent to 100% atomic. Nevertheless, the thickness of the layer will be such that this layer is constrained on the silicon substrate, that is to say less than the critical thickness beyond which the layer relaxes to give out dislocations. And vice versa in the case of depositing Si-rich $Si_{1-x}Ge_x$ on a germanium substrate. The various layers are deposited under conditions of temperature, pressure and active gas-species flux allowing conformity of the deposit to be obtained, that is to say a constant thickness of each film over the surface, the flanks and the bottom of the trench. This is important because the final result in terms of "line width" will depend on the precision of the thickness of the films on the flanks of the trench. These deposits may be produced using a conventional industrial single-wafer epitaxy machine, which proves particularly suitable for forming the desired $Si_{1-x}Ge_x$/Si multiple layers. The deposits used will preferably be in the surface regime, that is to say a deposition regime in which it is the surface coverage which controls the progress of the chemical reactions (as opposed to the diffusion regime). Hence, with precursor gases such as $SiH_4$, $GeH_4$ and $H_2$ (the latter also playing the part of a carrier gas), deposition temperatures varying from 450 to 700° C. may be used. In order to obtain a conformal deposit, especially with high aspect ratios, it is preferable to carry out the deposition with a low total pressure, typically of the order of 2.6 kPa (20 torr). However, higher pressures ranging up to atmospheric pressure may be used.

For certain applications, a layer of a planarizing or non-planarizing dielectric material, such as $SiO_2$ or $Si_3N_4$, may be deposited conventionally, for example by CVD, on the structure with filled trenches.

Optionally, the layers grown epitaxially or heteroepitaxially in the trenches may be doped with an n- or p-type dopant depending on the desired architecture.

After the various layers have been deposited, the chemical-mechanical polishing (CMP) is carried out in order to make the layers flush with the surface of the substrate. Any conventional CMP process may be used, the conditions being determined so as to obtain a plane surface whatever the architecture.

Lastly, for yet other applications, layers of materials such as Si, SiGe or dielectrics may be re-deposited on the polished surface after CMP, for example by conventional epitaxy.

The rest of the description refers to the appended figures, in which, respectively:

Figure 1A:
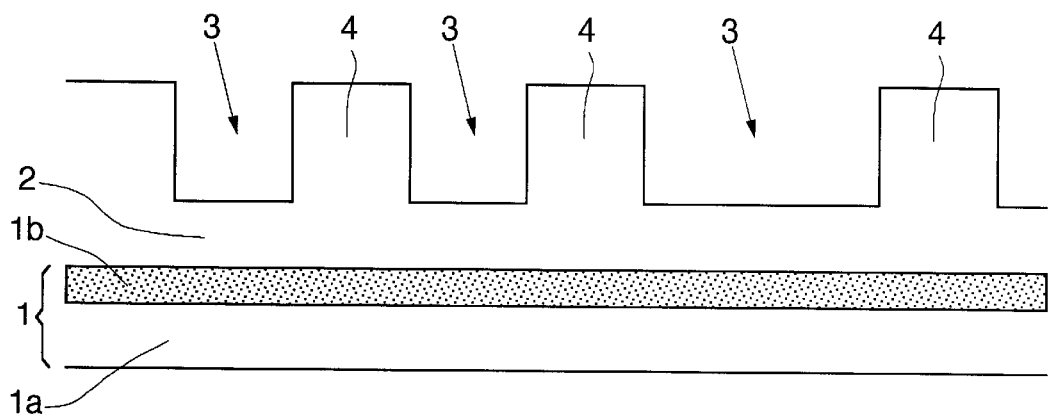
FIGS. 1a to 1d represent diagrammatic views in section (FIGS. 1a to 1c) and in perspective (FIG. 1d) of the main steps in an embodiment of the process of the invention.

Referring to FIGS. 1a to 1d, a first embodiment of the process of the invention will now be described.

After having formed a layer of silicon or germanium 2 conventionally, for example by epitaxy, on a substrate 1 such as an "insulator-on-silicon (IOS)" substrate comprising a layer of silicon 1a and a layer of silicon oxide 1b, trenches 3 having an aspect ratio d/w which is predetermined, but which may vary from one trench to another according to the desired final device, are etched conventionally in this layer 2.

Figure 1B:
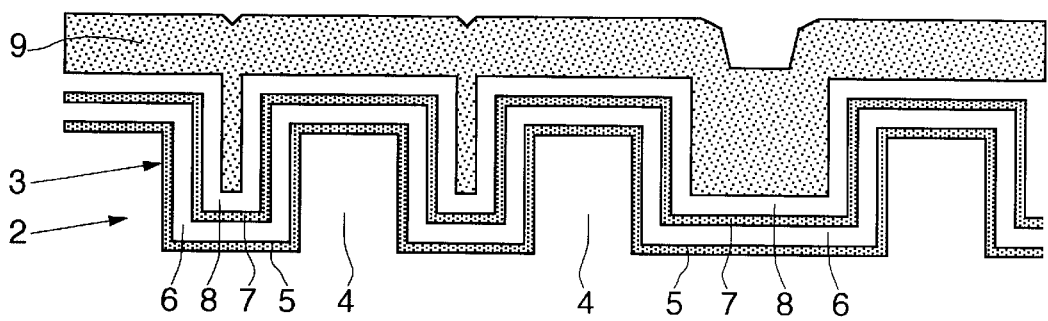

Alternate layers of $Si_{1-x}Ge_x$ 5, 7 and Si 6, 8 are then deposited successively, as FIG. 1b shows, on the upper surface of the layer 2, more particularly of the projections 4 bounding the trenches, and the walls of the trenches 3. Clearly, the number of alternate successive layers will depend on the thickness of these layers and on the desired final device.

In the example of an embodiment of the process which is represented, the successive alternate layers do not fill the trenches completely, but leave a recess therein, and a layer of a dielectric material 9 such as $SiO_2$ or $Si_3N_4$ is deposited, still conventionally, for example by CVD, so as to fill the recesses of the trenches and cover the alternate layers 5 to 8.

Figure 1C:
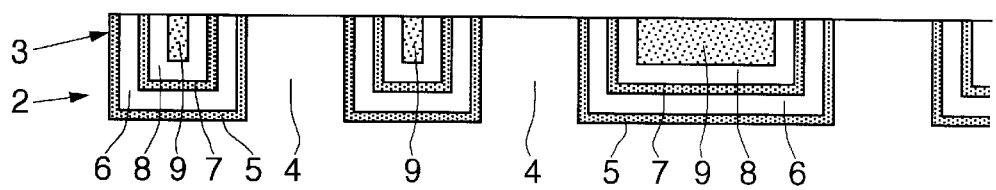
Figure 1D:
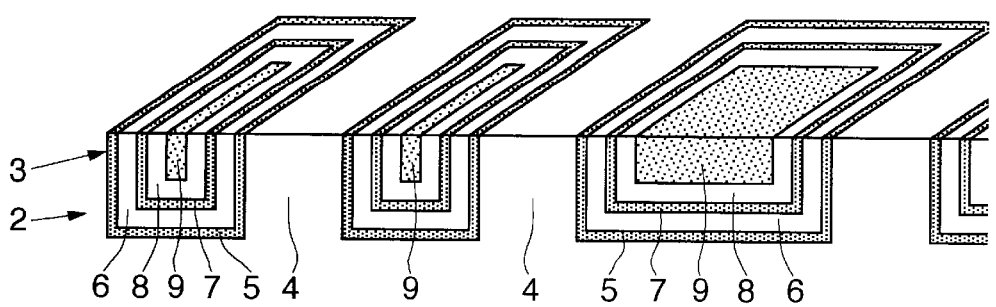

At this stage in the process, conventional chemical-mechanical polishing is carried out so as to remove superficial parts of the layer of dielectric material 9 and of the successive alternate layers 5 to 8 in order to obtain a heterostructure having a plane upper surface, level with which the successive alternate layers 5 to 8 and the layer of dielectric material 9 are flush, as FIGS. 1c and 1d show.

Adjacent regions, of various materials combined to produce the desired device, are hence obtained at the plane upper surface. After conventional production of predetermined contact regions, devices functioning in a plane are obtained, such as quantum wells allowing detection at different wavelengths with illumination normal to the surface, that is to say without absorption in the different layers, this being by virtue of different trench widths.

FIGS. 2a to 2e, in which the same reference numbers represent the same elements, illustrate a second embodiment of the process of the invention.

Figure 2A:
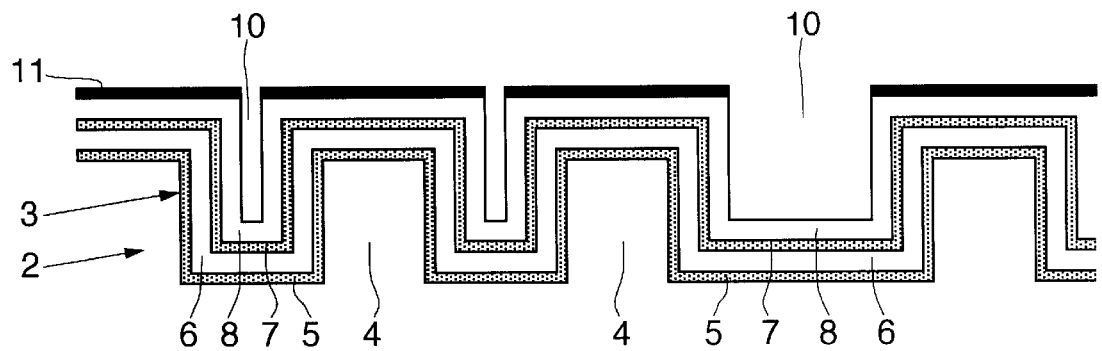
FIGS. 2a to 2e represent diagrammatic views in section (FIGS. 2a to 2d) and in perspective (FIG. 2e) of the main steps in a second embodiment of the process of the invention.
Figure 2B:
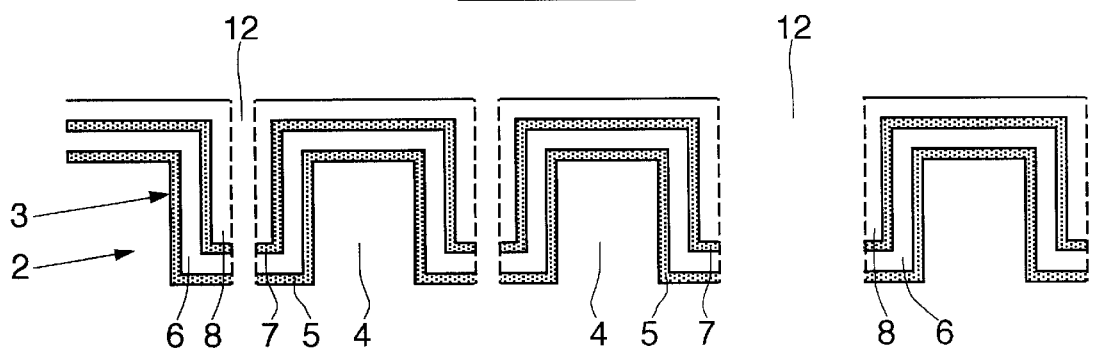
Figure 2C:
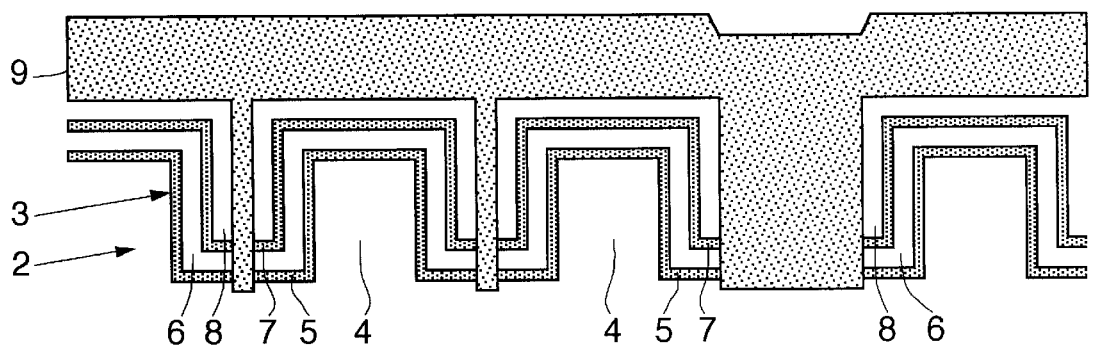

As FIG. 2a shows, after having produced, as before, a structure comprising a layer of Si or Ge 2 including trenches 3 and coated with successive alternate layers of $Si_{1-x}Ge_x$ and Si, also as described in relation to FIGS. 1a to 1d, the upper surface of the structure is coated conventionally, for example by photolithography, with a resin mask 11 having a suitable pattern, leaving the unfilled parts or recesses 10 of the trenches exposed. This photolithography is not critical because it takes place outside the active regions of the device.

The structure is then etched conventionally in order to uncover the bottoms of the unfilled parts of the trenches, and hence to form extended recesses 12 penetrating down into the layer of Si or Ge 2.

Figure 2D:
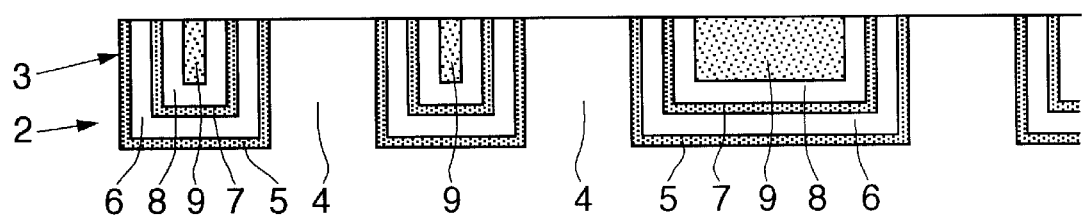
Figure 2E:
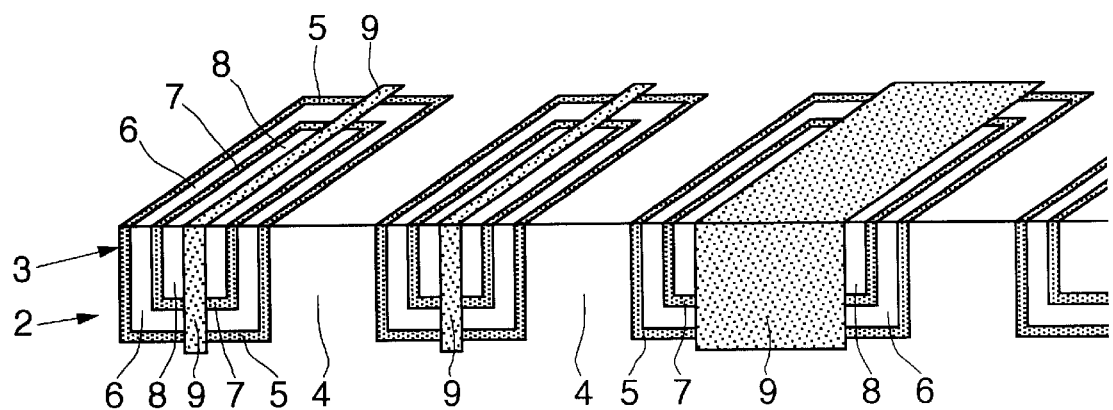

Then, as before, a layer 9 of insulating material is deposited so as to fill the extended recesses 12 in order to insulate the various active regions (FIG. 2c), and chemical-mechanical polishing is carried out in order to obtain the planar heterostructure represented in FIGS. 2d and 2e.

FIGS. 3a to 3d, where the same reference numbers represent the same elements, diagrammatically illustrate another embodiment of the insulation of the active regions of a planar heterostructure according to the invention.

Figure 3A:
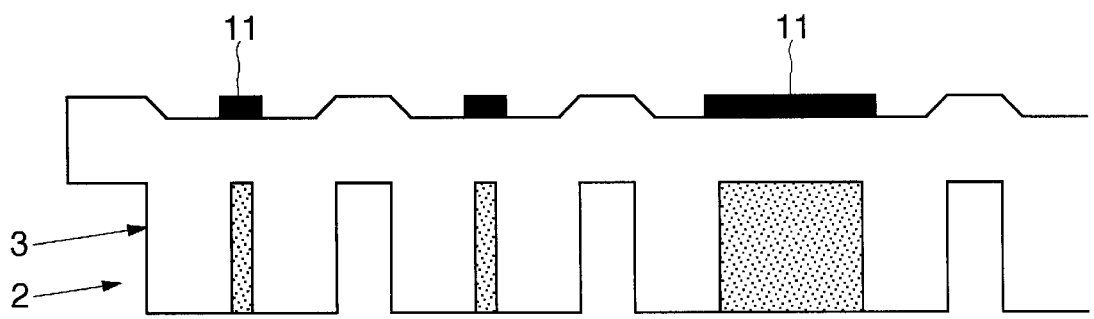
FIGS. 3a to 3d represent diagrammatic views in section of the main steps in a third embodiment of the process of the invention.

As FIG. 3a shows, after having formed trenches in a layer 2 of Si or Ge, the trenches are filled and the layer 2 is covered with a dielectric material 9. A predetermined pattern of a masking resin 11 is then produced conventionally on the layer 9 of dielectric material.

Figure 3B:
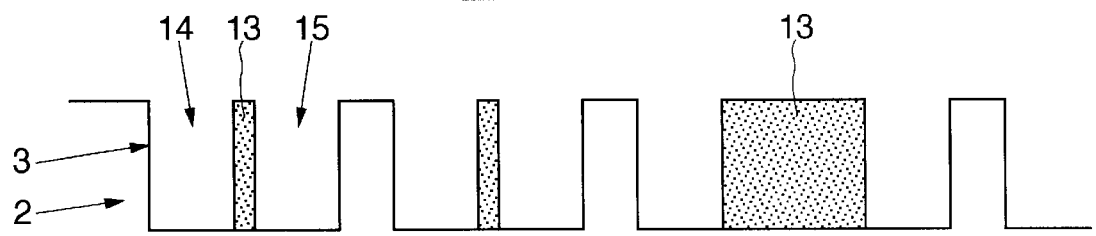
Figure 3C:
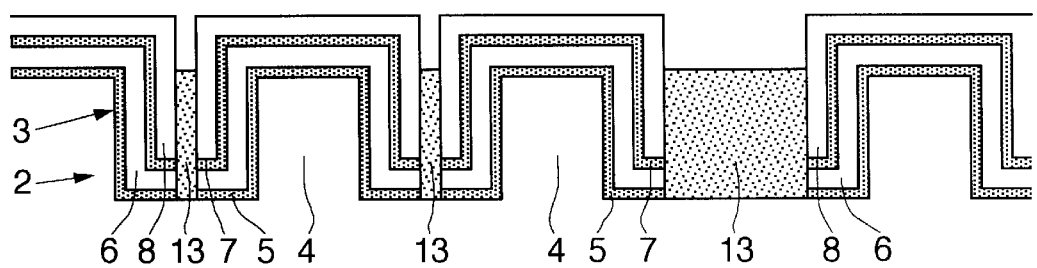

As FIG. 3b shows, the pattern of resin 11 is such that, after etching, all that remains of the layer of dielectric material 9 is the, for example central, walls 13 with predetermined thickness dividing the trenches into two half-trenches 14, 15.

Figure 3D:
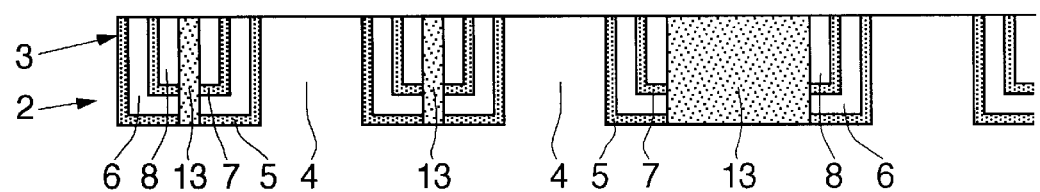
Figure 2D:
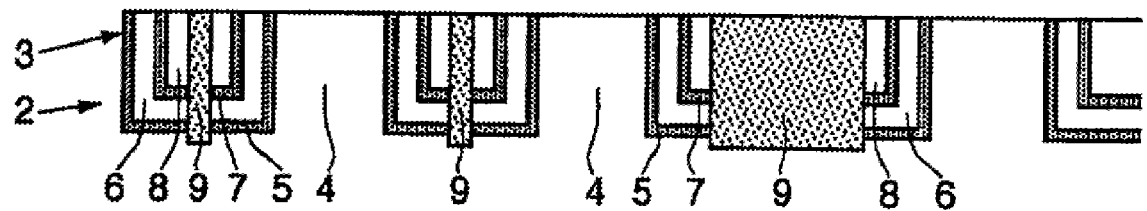
Figure 2E:
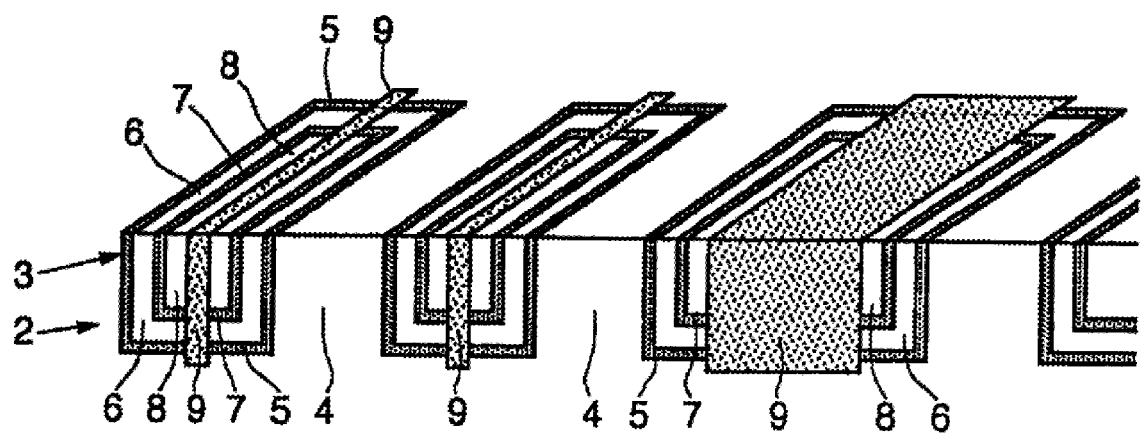

The alternate successive layers of Si and SiGe 5–8 are then deposited in the half-trenches and on the surface of the layer 2 (FIG. 3c), and then chemical-mechanical polishing is carried out in order to obtain the planar heterostructure in FIG. 3d.

Examples of Embodiments Based on Multiple Quantum Wells

| Fabrication of quantum wires | |
| --- | --- |
| Thicknesses of the alternate layers | |
| SiGe (15–20% at. Ge content) | <10 nm |
| Ge | 0.5 to 5 nm |
| Si | ≦10 nm |
| SiGe/Si multiple layers: | X periods |
| Width of the trench: | w = [X (20 + 10)] × 2 |

Depth of the trench in the substrate: d>500 nm (d>w)

CMP until all the layers are flush

Optional encapsulation layer of dielectric material or Si.

Detector Based on SiGe/Si

Same structure as above plus an alternating sequence of adjacent trenches with variable pitch whose sum is less than the area of the light spot (Production of detection matrices).

Fabrication of a Laser Structure Based on Si

Same structure as before, but having trench widths in order to obtain the three pumping levels for laser emission in a plane.

What is claimed is:

1. Process for fabricating a planar heterostructure, characterized in that it comprises:

a) etching, in a semiconductor substrate and starting from an upper main surface of the substrate, at least one trench having a bottom wall and vertical side walls;

b) depositing, on the upper main surface of the substrate and the bottom and side walls of the trench, a stack of successive and alternate layers of $Si_{1-x}Ge_x$ (0<x≦1) and Si (5–8), the number and the thickness of which depend on the final use intended for the heterostructure; and c) chemical-mechanical polishing in order to obtain a final heterostructure having a plane upper main surface, level with which the stack layers deposited in the trench are flush.

2. Process according to claim 1, characterized in that the stack of successive alternate layers does not fill the trench completely, and in that it furthermore comprises, before the chemical-mechanical polishing step, depositing a layer (9) of dielectric material in order to fill the trench.

3. Process according to claim 1, characterized in that the stack of successive alternate layers (5–8) in the trench (3) leaves a recess (10) in the trench, and in that, before the chemical-mechanical polishing step, the stack is etched so as to extend the recess down into the material of the substrate, and a layer of dielectric material (9) is deposited so as to fill the extended recess (12).

4. Process according to claim 1, characterized in that, prior to the deposition of the stack, a layer of dielectric material filling the trench is deposited, the dielectric material is etched in order to form, in the trench, a wall dividing the trench into two half-trenches, and the two half-trenches are filled by carrying out the deposition in step (b).

5. Process according to claim 1 further comprising:

etching a plurality of trenches with identical or different widths.

6. Process according to claim 1, wherein the substrate is a silicon or germanium bulk substrate.

7. Process according to claim 1, wherein the substrate is a silicon-on-insulator (SOI) substrate.

8. Process according to claim 1, wherein, after etching the trench, the process further comprises oxidizing the walls of the trench and removing the oxide formed.

* * * * *

UNITED STATES PATENT AND TRADEMARK OFFICE
CERTIFICATE OF CORRECTION

PATENT NO. : 6,399,502 B1  Page 1 of 2
APPLICATION NO. : 09/540188
DATED : June 4, 2002
INVENTOR(S) : Hernandez et al.

It is certified that error appears in the above-identified patent and that said Letters Patent is hereby corrected as shown below:

Delete drawing sheet 3 of 4, consisting of figures 2d and 2e, and replace with replacement drawing sheet 3 of 4 consisting of figures 2d and 2e. (attached)

Signed and Sealed this

Fourth Day of November, 2008

JON W. DUDAS
*Director of the United States Patent and Trademark Office*